(12) United States Patent
Gandhi et al.

(10) Patent No.: US 6,185,691 B1
(45) Date of Patent: Feb. 6, 2001

(54) CLOCK GENERATION

(75) Inventors: Jayanti L. Gandhi; Chao Zhang, both of Tempe, AZ (US)

(73) Assignee: Intel Corporation, Santa Clara, CA (US)

( * ) Notice: Under 35 U.S.C. 154(b), the term of this patent shall be extended for 0 days.

(21) Appl. No.: 08/999,281

(22) Filed: Dec. 29, 1997

(51) Int. Cl.[7] .................................................... G06F 1/06
(52) U.S. Cl. ............................ 713/500; 713/501; 713/502
(58) Field of Search .............................. 713/500, 501, 713/502, 503; 327/172, 175

(56) References Cited

U.S. PATENT DOCUMENTS

| | | | |
|---|---|---|---|
| 4,366,394 | * 12/1982 | Clendening et al. | ................... 377/47 |
| 4,807,266 | * 2/1989 | Taylor | ..................... 377/48 |
| 4,922,141 | 5/1990 | Lofgren et al. . | |
| 5,087,829 | 2/1992 | Ishibashi et al. . | |
| 5,410,683 | * 4/1995 | Al-Khairi | .............................. 713/501 |
| 5,428,309 | 6/1995 | Yamauchi et al. . | |
| 5,488,646 | * 1/1996 | Jones et al. | .............................. 377/47 |
| 5,712,884 | 1/1998 | Jeong . | |
| 5,812,832 | * 9/1998 | Horne et al. | ......................... 713/501 |
| 5,914,996 | * 6/1999 | Huang | ..................... 377/39 |

* cited by examiner

*Primary Examiner*—Dennis M. Butler
(74) *Attorney, Agent, or Firm*—Trop, Pruner, Hu & Miles, P.C.

(57) ABSTRACT

A clock divider receives a main clock and generates divided clocks (even or odd division) each having generally a half duty cycle. The clock divider includes flip flops connected to form a master-slave counter in which the master components are clocked off a first clock and the slave components are clocked off a second clock that is inverted from the first clock. The master-slave counter is a ring counter, and outputs from the master-slave counter are routed to decoding circuitry to generate divided clocks.

29 Claims, 8 Drawing Sheets

|  | Q1 | Q2 | Q3 | Q4 | Q5 | Q6 | STATE |
|---|---|---|---|---|---|---|---|
| CLKBAR | 0 | 0 | 0 | 0 | 0 | 0 | 0 |
| CLK | 1 | 0 | 0 | 0 | 0 | 0 | 1 |
| CLKBAR | 1 | 1 | 0 | 0 | 0 | 0 | 2 |
| CLK | 1 | 1 | 1 | 0 | 0 | 0 | 3 |
| CLKBAR | 1 | 1 | 1 | 1 | 0 | 0 | 4 |
| CLK | 1 | 1 | 1 | 1 | 1 | 0 | 5 |
| CLKBAR | 1 | 1 | 1 | 1 | 1 | 1 | 6 |
| CLK | 0 | 1 | 1 | 1 | 1 | 1 | 7 |
| CLKBAR | 0 | 0 | 0 | 1 | 1 | 1 | 8 |
| CLK | 0 | 0 | 0 | 0 | 1 | 1 | 9 |
| CLKBAR | 0 | 0 | 0 | 0 | 1 | 1 | 10 |
| CLK | 0 | 0 | 0 | 0 | 0 | 1 | 11 |

Figure 4

CLOCK GENERATION

BACKGROUND

The invention relates to generating clocks for use in electronic systems.

Clocks are used throughout an electronic system, such as a computer system, to synchronize events communicated among chips in a system as well as among devices inside a chip. At the system level, a master clock generator provides a master clock which is typically of a very high frequency. This master clock is divided down and provided to components throughout the system. At the chip level, a phase locked loop (PLL) circuit generates internal clocks for use by circuitry in the chip. The clocks generated by the PLL circuit are synchronized to an external clock.

Both at the system level and at the chip level, different frequency clocks are typically required for different parts of the system or chip. Clock dividers are used to divide a clock to a desired lower frequency clock. Thus, for example, a main clock can be divided by 2, 3, 5, 6, and so forth. If the main clock has generally a 50% or half duty cycle (i.e., the clock pulse high width is the same as the clock pulse low width), division by an even number (e.g., 2, 4) will result in a divided clock also having generally a 50% duty cycle. However, using typical clock dividers, division by an odd number may result in clocks having duty cycle that is not at 50%. For example, a divide by three clock may have a high pulse width to low pulse width ratio of 1:2, that is, the clock's high pulse width is half its low pulse width.

SUMMARY

The invention is directed to generating a divided clock from a main clock, with the divided clock generally having a half duty cycle.

In general, in one aspect, the invention features a clocking circuit for generating an output clock. The clocking circuit includes a master counting device coupled to receive a first clock and a slave counting device coupled to receive a second clock. The second clock is an inverted version of the first clock. A decoder receives outputs of the master and slave counting devices to generate an output clock that is a divided version of the first clock.

In general, in another aspect, the invention features a method of generating a divided clock from a main clock. A master counter is advanced in response to the main clock, and a slave counter is advanced in response to an inverted version of the main clock. Output bits from the master and slave counters are decoded to generate the divided clock.

Other features and advantages will become apparent from the following description and from the claims.

BRIEF DESCRIPTION OF THE DRAWINGS

FIG. 4 is a table listing the possible legal states of a counter in the clock divider.

DETAILED DESCRIPTION

Figure 1:
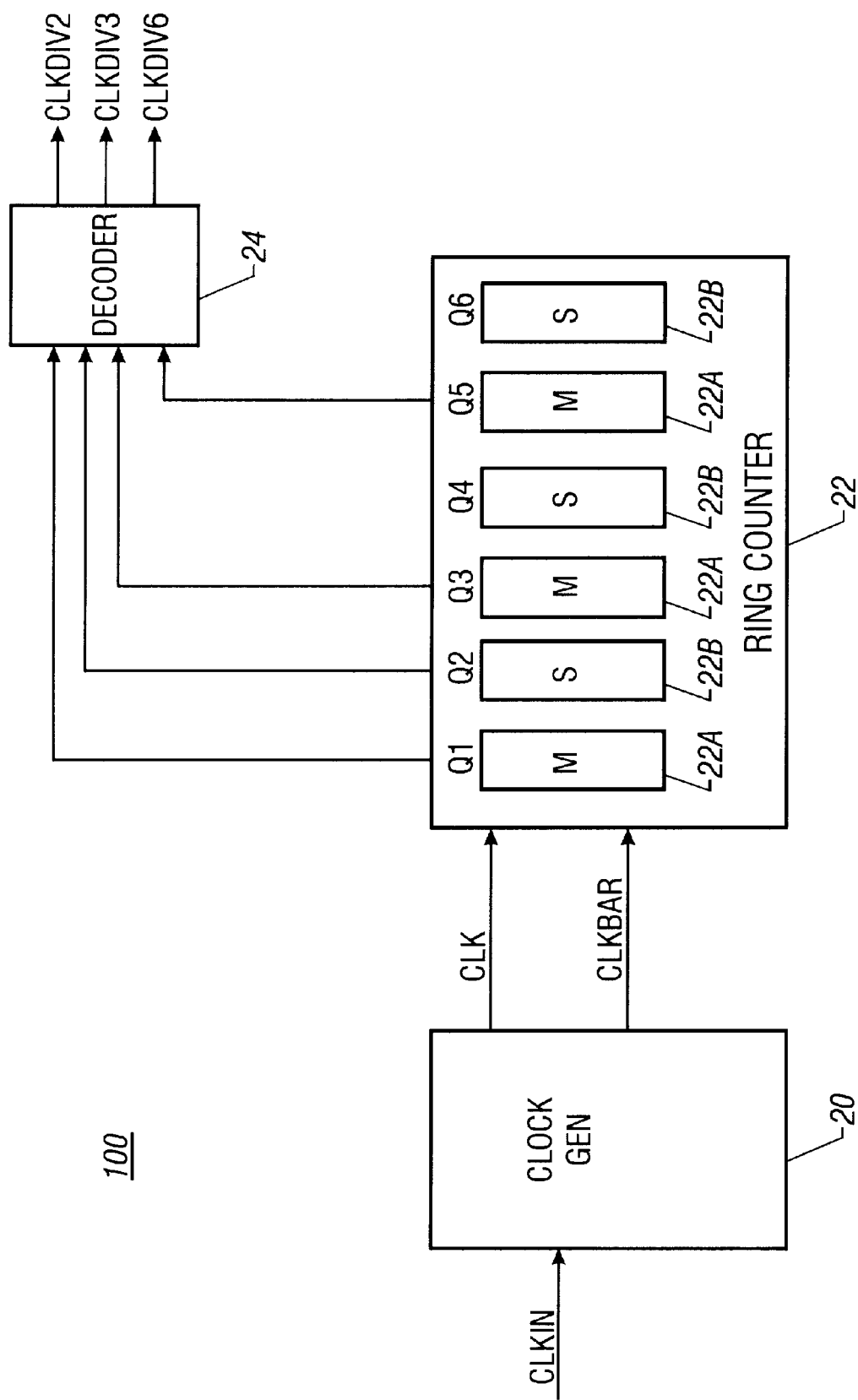
FIG. 1 is a logic diagram of a clock divider according to the invention.

Referring to FIG. 1, a clock divider 100 for use in a microelectronic device or in a computing system is shown. The clock divider 100 can provide divided clocks based on a main clock (CLKIN) which can run at, for example, about 198 MHz. CLKIN can be generated by a PLL in a microelectronic device or by a main clock generator in a system. In one embodiment, the clock divider includes a master-slave ring counter 22 which cycles through predetermined legal states. Outputs Q1, Q2, Q3, and Q5 of the ring counter 22 are decoded by a decoder 24 to generate divided clocks CLKDIV2, CLKDIV3, and CLKDIV5. If the ring counter 22 reaches an illegal state, the ring counter 22 includes a self-initialization circuit to re-initialize the ring counter to a legal state.

In the clock divider 100, a clock generator 20 creates a true version (CLK) and an inverted version (CLKBAR) of CLKIN. CLK and CLKBAR are provided to clock inputs of the ring counter 22. CLK controls the master portion 22A of the counter 22, which provides the Q1, Q3 and Q5 outputs. CLKBAR controls the slave portion 22B of the counter, which provides the Q2, Q4, and Q6 outputs. By selectively decoding different combinations of the ring counter outputs, different divided versions of CLKIN can be created. By using both CLK and CLKBAR to control outputs of the ring counter 22, 50% duty cycle clocks can be generated, even for clocks divided by an odd number.

Figure 2A:
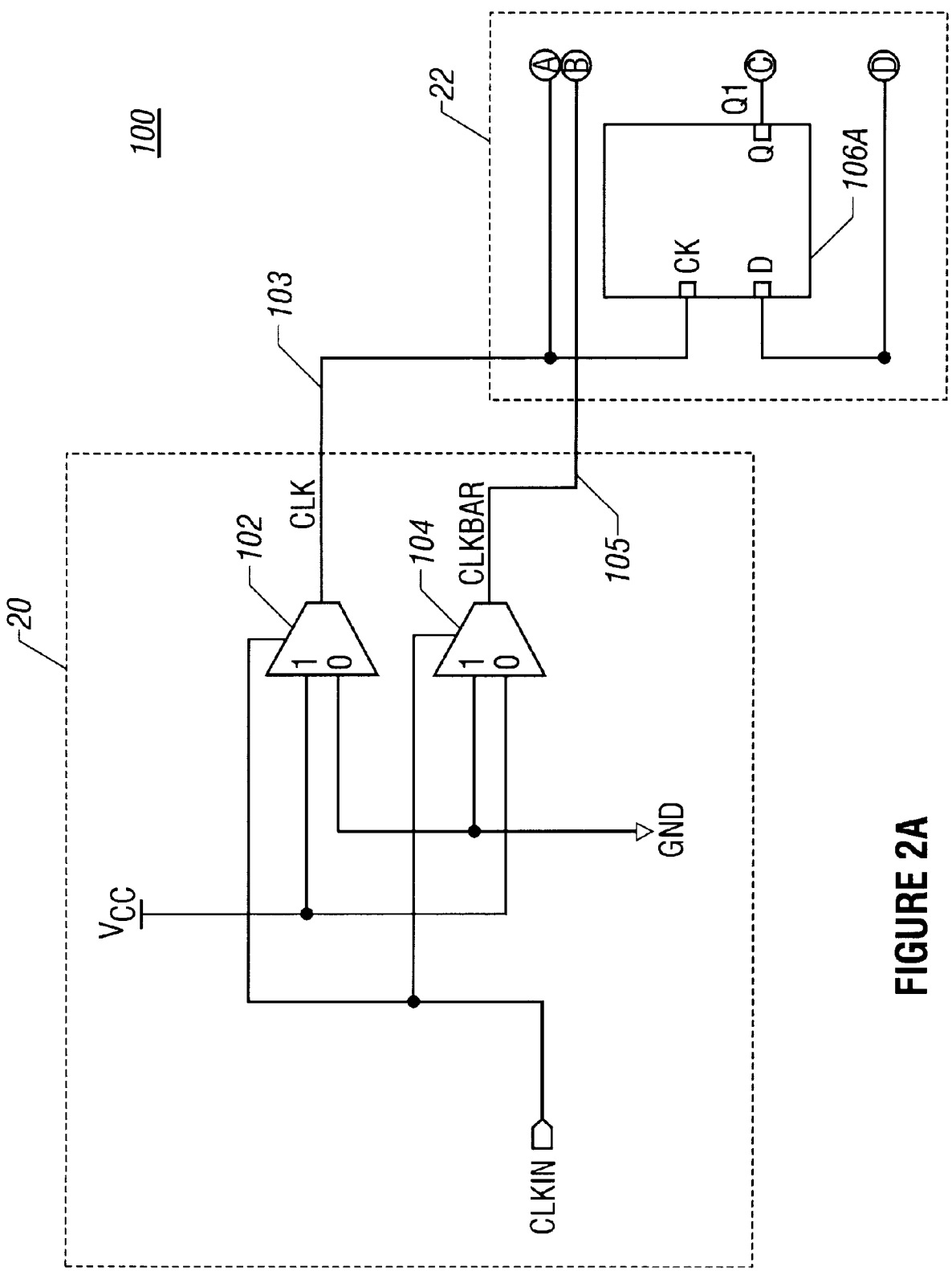
FIGS. 2A and 2B are a logic diagram of the clock divider of FIG. 1.
Figure 2B:
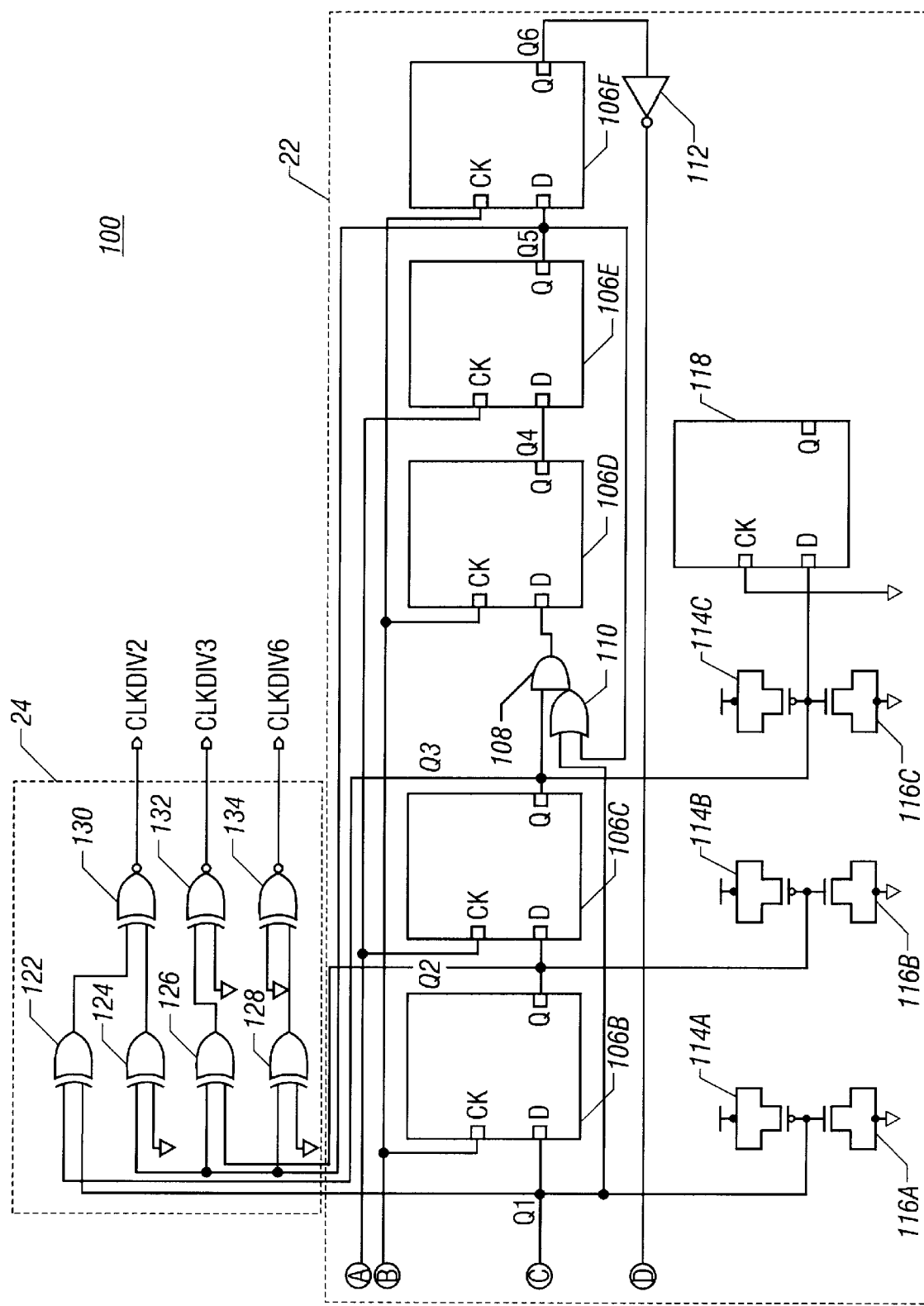

Referring to FIGS. 2A and 2B, the clock generator 20 includes two multiplexers 102 and 104. The multiplexer 102 generates the true clock CLK and the multiplexer 104 generates the inverted clock CLKBAR. CLKIN is connected to the select input of each of the multiplexers 102 and 104. The "1" inputs of the multiplexers 102 and 104 receive opposite states. For example, the "1" input of the multiplexer 102 is connected to a high state (VCC), while the "1" input of the multiplexer 104 is connected to a low state (GND). Similarly, the "0" inputs of the multiplexers 102 and 104 are connected to opposite states, with the "0" input of the multiplexer 102 connected to GND and the "0" input of the multiplexer 104 connected to VCC. Thus, as CLKIN toggles, each of the multiplexers 102 and 104 alternately selects its "0" or "1" input to toggle CLK or CLKBAR. Generated using the circuitry shown, CLK and CLKBAR are balanced with respect to one another since the clock drive circuits (multiplexers 102 and 104) are the same, resulting in the same rise and fall times and propagation delays.

Alternatively, a balanced true version and inverted version of a clock can be provided to the clock divider 100.

To reduce the RC delay of the interconnecting lines 103 and 105 connecting the outputs of the multiplexers 102 and 104, respectively, to the remaining circuitry of the clock divider 100, wider electrically conductive lines can be used to route CLK and CLKBAR. In addition, to reduce the effects of noise, each of the CLK and CLKBAR interconnecting lines is shielded on both sides. Common methods of shielding include routing ground lines on both sides of the shielded line.

The clock divider 100 includes a predetermined number of D-type flip flops providing outputs that are decoded to generate the desired divided clocks. In the embodiment shown in FIG. 1, six flip flops 106A–F form a ring counter whose outputs are decoded to provide divide-by-two, divide-by-three, and divide-by-six clocks divided from CLKIN. The clock inputs of the flip flops 106A–F, which are connected in a serial chain with the last data output (Q) fed back to the first data input (D) to form a loop, are alternately connected to receive CLK and CLKBAR. Thus, the clock inputs of the flip flops 106A, 106C and 106E receive CLK, while the clock inputs of the flip flops 106B, 106D, and 106F receive CLKBAR. By using a counter that is clocked off both the CLK and CLKBAR edges, the generated divided clocks (including both odd and even divided clocks) can be balanced to have generally 50% duty cycles. This is described further below.

The output (Q1) of the first flip flop 106A is connected to the D input of the next flip flop 106B in the chain, and the output (Q2) of the flip flop 106B is connected to the D input of the flip flop 106C. The output (Q3) of the flip flop 106C is connected to one input of an AND gate 108, whose other input is connected to receive the output (Q1) of an OR gate 110. The two inputs of the OR gate 110 are connected to the output (Q1) of the flip flop 106A and the output (Q5) of the flip flop 106E. The output of the AND gate 108 is connected to the D input of the flip flop 106D, whose output (Q4) is in turn connected to the D input of the flip flop 106E. The output (Q5) of the flip flop 106E is connected to the D input of the flip flop 106F. Finally, the output (Q6) of the last flip flop 106F is inverted by an inverter 112 and routed back to the D input of the flip flop 106A.

Connected in this configuration, a 3-bit master-slave Johnson ring counter is provided. Flip flops 106A, 106C, and 106E form the master portion 22A of the counter whereas flip flops 106B, 106D, and 106F form the slave portion 22B. The outputs Q1, Q3, and Q5 of flip flops 106A, 106C, and 106E (the master portion) provide the following binary count sequence: 000, 100, 110, 111, 011, 001. The entire 6-bit ring counter sequence is illustrated in FIG. 4, where the states of Q1, Q2, Q3, Q4, Q5, and Q6 are shown on the rising edge of CLK or CLKBAR.

The illegal states of the ring counter illustrated in the embodiment of FIG. 2A and 2B are binary values 101 and 010 on outputs Q1, Q3, and Q5. Self-initialization of the ring counter is performed upon detection of an illegal state. One way in which the counter can enter an illegal state is during power up reset. Using Johnson counter sequence theory, detection of only one illegal state is sufficient to cover all illegal states, because after certain clock cycles the other illegal states will rotate to the one illegal state. Thus, the detected illegal state is binary value 010 on Q1, Q3 and Q5. This state is detected by the detector formed by the AND gate 108 and the OR gate 110. Occurrence of 010 will cause the AND gate 108 to output a low state, which will cause the flip flop 106D to receive a low state rather than a high state at its D input. On the next rising edge of CLK, the low state is loaded into the input of flip flop 106E, thereby clearing the illegal condition by resetting the ring counter to the 000 state.

To balance the load seen by the outputs of flip flops 106A–C, load circuitry (including P-channel MOSFETs 114A–C and N-channel MOSFETs 116A–C) is connected to the outputs of the flip flops 106A–C. The P-channel MOSFET 114 has its source and drain connected to VCC and the N-channel MOSFET 116 has its source and drain connected to GND. The gates of both transistors 114 and 116 are connected to the corresponding output of a flip flop 106. The widths and lengths of the transistors 114 and 116 are selected so that the capacitive loads seen by output nodes Q1, Q2, Q3, and Q5 are the same. This is important because Q1, Q2, Q3, and Q5 are connected to decoding circuitry that generates the divided clocks CLKDIV2, CLKDIV3, and CLKDIV6. The RC timings of the nodes Q1, Q2, Q3, and Q5 are maintained at about the same value so that the outputted divided clocks are not skewed with respect to one another. Because the output of the flip flop 106C is connected only to the input of an AND gate 108, an additional load in the form of a dummy D-type flip flop 118 is connected to the output of the flip flop 106C.

Figure 3A:
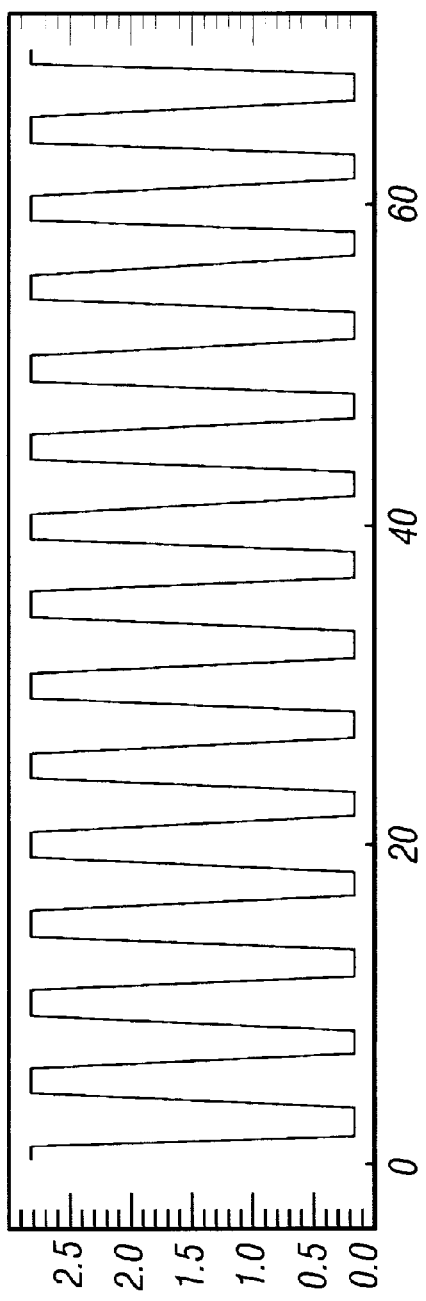
FIGS. 3A–D are timing diagrams of clocks associated with the clock divider.
Figure 3B:
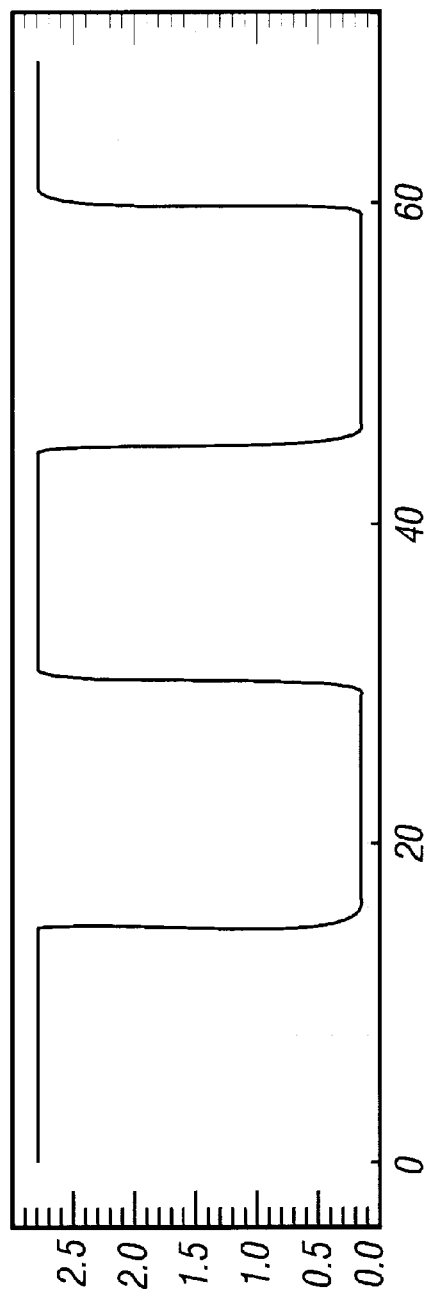
Figure 3C:
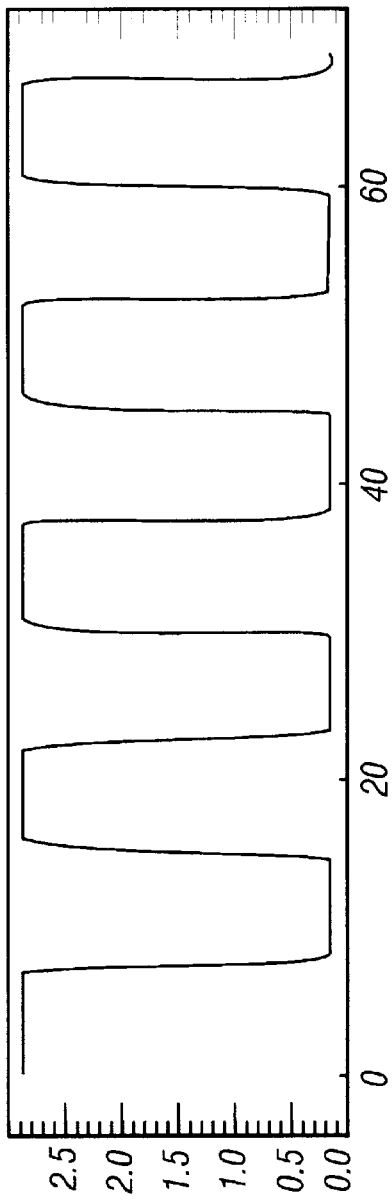
Figure 3D:
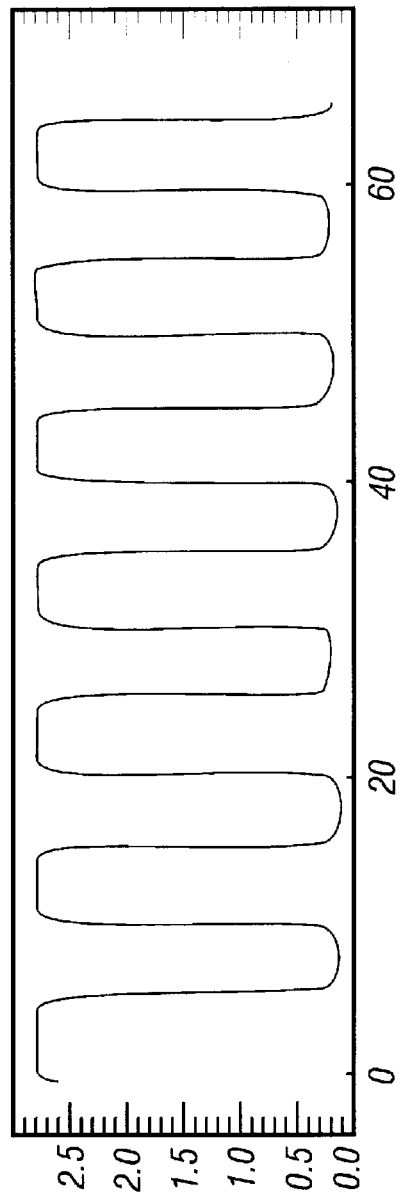

To generate the divided clocks CLKDIV2, CLKDIV3, and CLKDIV6, the outputs of the flip flops 106A–E are provided to the decoder 24, which includes a set of exclusive OR and exclusive NOR gates. An exclusive OR gate 122 receives Q1 and Q3. The exclusive OR gate 124 receives Q5 and a low state. The outputs of the exclusive OR gates 122 and 124 are routed to the inputs of an exclusive NOR gate 130, which is connected to drive the divide-by-two clock CLKDIV2. Referring to FIG. 4, the signal CLKDIV2 will be high in counter states 3, 4; 7, 8; 11, 0; and low in states 1, 2; 5, 6; 9, 10. The divide-by-two clock is illustrated in FIG. 3D.

The exclusive OR gate 126 receives Q2 and Q5. The output of the exclusive OR gate 126 is connected to one input of an exclusive NOR gate 132, whose other input receives a low state. The output of the exclusive NOR gate 132 is connected to the divide-by-three clock CLKDIV3. The gates 124 and 132 effectively perform an exclusive NOR of Q2 and Q5. Referring to FIG. 4, the signal CLKDIV3 is high in counter states 5, 6, 7, 11, 0, 1; and low in counter states 2, 3, 4, 8, 9, 10.

The exclusive OR gate 128 receives Q5 and a low state. The output of the exclusive OR gate 128 is connected to one input of an exclusive NOR gate 134, whose other input receives a low state. The output of the exclusive NOR gate 134 is connected to the divide-by-six CLKDIV6. Effectively, the gates 128 and 134 provide an inverter for input Q5. The signal CLKDIV6 is high in counter states 5–10; and low in counter states 11 and 0–4. CLKDIV6 is illustrated in FIG. 3B.

In the timing diagrams of the main clock CLKIN and the divided clocks in FIGS. 3A–D, the main clock CLKIN runs at about 198 MHz, the divide-by-six clock CLKDIV6 runs at about 33 MHz, the divide-by-three clock CLKDIV3 runs at about 66 MHz, and the divide-by-two clock CLKDIV2 runs at about 99 MHz. As illustrated in each of FIGS. 3B, 3C and 3D, the duty cycle of each of the clocks CLKDIV6, CLKDIV3, and CLKDIV2 is generally about 50%.

Figure 5:
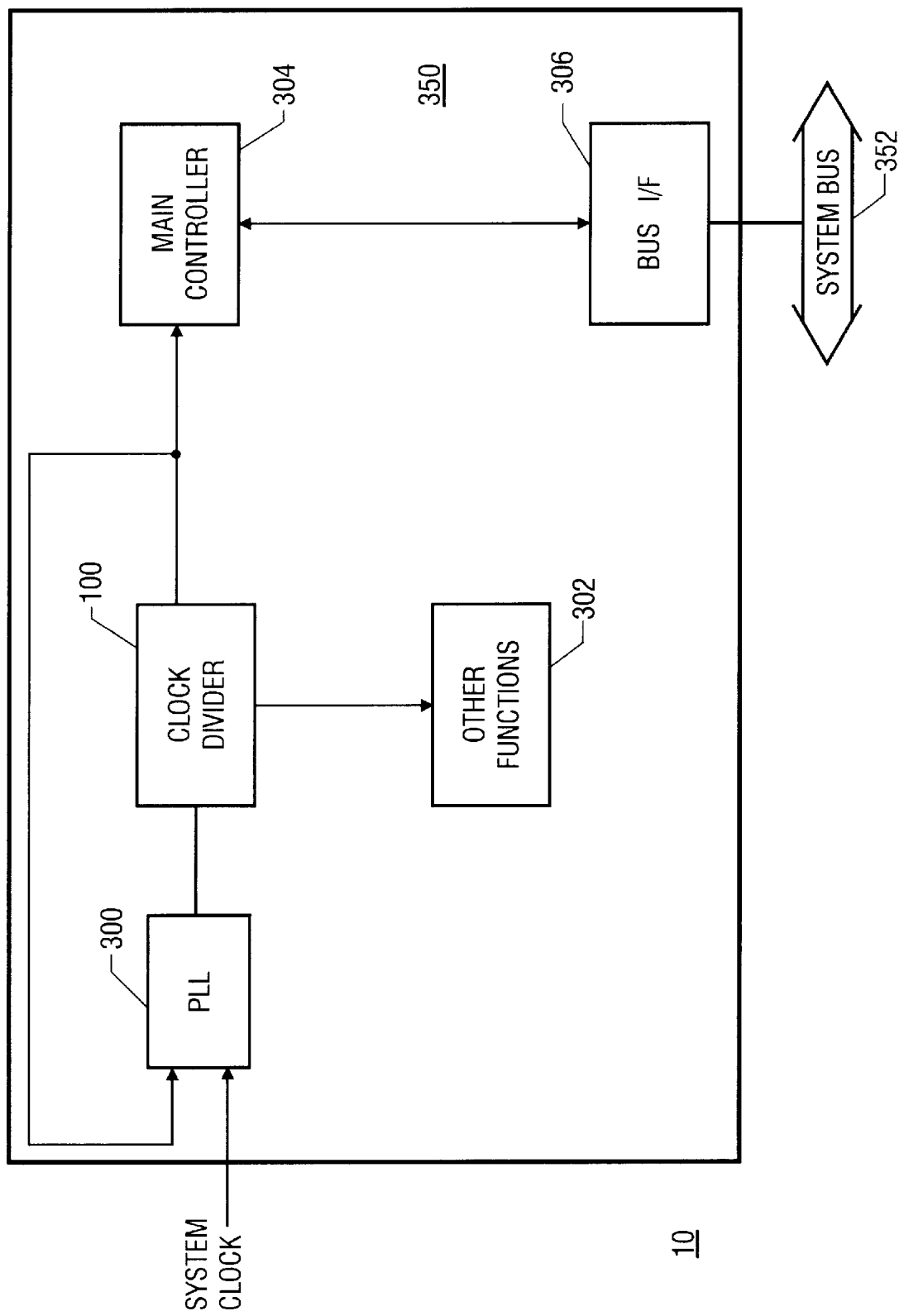
FIG. 5 is a block diagram of an integrated circuit.

Referring to FIG. 5, the clock divider 100 can be used in an integrated circuit device 350 that is connected to a system bus 352 in a computer system 10. The device 350 includes a bus interface 306 for interfacing to the system bus 352, and a main controller 304. The device 350 can also include a block 302 to perform other control functions. Circuitry in the main controller 304, the bus interface 306, and the control block 302 may have different clock frequency requirements. Therefore, the clock divider 100 receives the main clock from a PLL 300 and generates from the main clock divided clocks that are provided to the main controller 304, bus interface 306, and control block 302. The PLL 300 receives a computer system clock as well as an output of the clock divider 300 to generate the main clock for the integrated circuit device 350.

Figure 6:
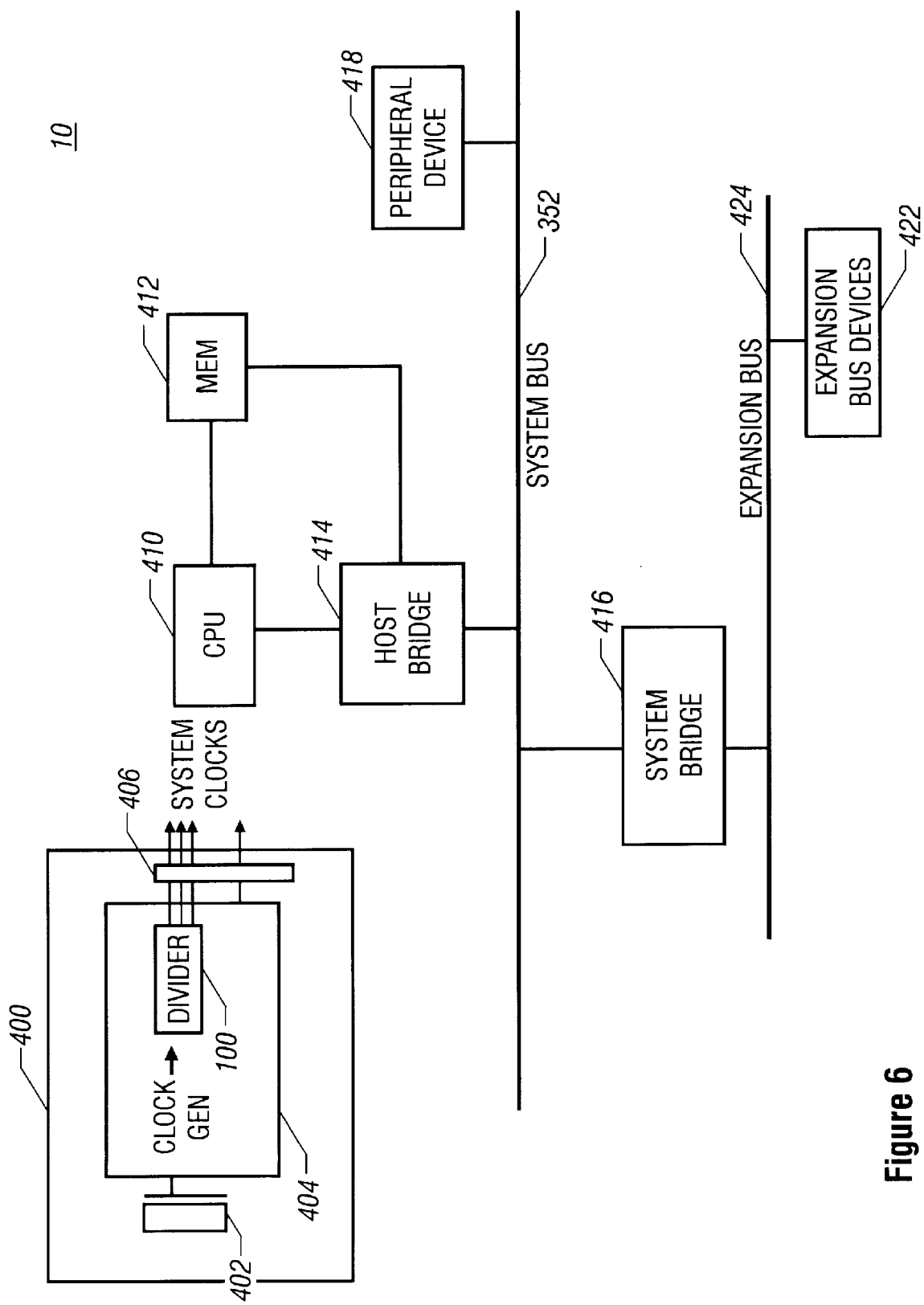
FIG. 6 is a block diagram of a computer system.

Referring to FIG. 6, the clock divider 100 can also be used to generate system clocks for the computer system 10. The clock divider 100 can be implemented in a clock generator 404 that is part of clock circuitry 400. The clock generator receives a master clock from an oscillating crystal 402. The clock generator 404 provides a buffered version of the master clock to the clock divider 100, which generates divided system clocks driven to various components of the computer system 10.

The computer system 10 includes a central processing unit 410 connected to a main memory 412. The CPU 410 and the main memory 412 are connected through a host bridge 414 to a system bus 352, e.g., a Peripheral Component Interconnect (PCI) bus. The system bus 352 can be connected to peripheral devices 418. The computer system 10 also includes an expansion bus 424, which is connected through a system bridge 416 to the system bus 352. The expansion bus 424 can be an Industry Standard Architecture (ISA) or an Extended Industry Standard Architecture (EISA) bus. Expansion bus devices 422 can be connected to the expansion bus 424.

The components of the computer system typically have varying clock frequency requirements. For example, the CPU 410 typically has the highest clock frequency requirement, the peripheral devices 418 on the system bus 352 typically have an intermediate frequency requirement, and the expansion bus devices 422 typically have one of the lowest clock frequency requirements.

Other embodiments are within the scope of the following claims. For example, the clock divider shown can be modified to generate other divided clocks, such as clocks that are divided by 5, divided by 7, and so forth. To divide by 5, for example, a 10 flip-flop chain can be used. The invention has been illustrated with specific embodiments having specific configurations and numbers of devices. Such configurations and numbers can be varied.

What is claimed is:

1. A clocking circuit for generating an output clock, comprising:
    a master counting device coupled to receive a first clock;
    a slave counting device coupled to receive a second clock, the second clock being an inverted version of the first clock; and
    a decoder receiving outputs of the master and slave counting devices to generate an output clock that is a divided version of the first clock.

2. The clock circuity of claim 1, wherein the master counting device includes flip flops clocked by the first clock and the slave counting device includes flip flops clocked by the second clock.

3. The clocking circuit of claim 2, wherein the flip flops are connected in a serial chain, successive flip flops being alternately from the master counting device and the slave counting device.

4. The clock circuit of claim 1, wherein the decoder generates an output clock that is divided by an odd number from the first clock.

5. The clocking circuit of claim 4, wherein the output clock has generally a half duty cycle.

6. The clocking circuit of claim 1, further comprising a first clock generator for generating the first clock and a second clock generator for generating the second clock, both the first and second clock generators receiving a main clock.

7. The clock circuit of claim 6, wherein the first and second clock generators contain the same circuitry to provide balanced first and second clocks.

8. The clocking circuit of claim 6, wherein each of the first and second clock generators includes a multiplexer controlled by a main clock.

9. A clock divider for dividing a main clock, comprising:
    a master-slave ring counter having a master portion clocked by the main clock and a slave portion clocked by an inverted version of the main clock; and
    a decoder receiving outputs of the ring counter to generate a divided clock.

10. The clock divider of claim 9, wherein the decoder generates at least another divided clock.

11. The clock divider of claim 9, wherein the divided clock is divided by an odd number.

12. The clock divider of claim 9, wherein the ring counter includes a series of flip flops connected in a chain starting with a first flip flop and ending with a last flip flop, an output of the last flip flop connected back to an input of the first flip flop.

13. The clock divider of claim 12, wherein the flip flops are alternately clocked by the main clock and the inverted version of the main clock.

14. The clock divider of claim 12, wherein the ring counter includes six flip flops providing six output bits.

15. The clock divider of claim 14, wherein the decoder receives output bit 5 and output bit 2 of the ring counter to generate a divide-by-three clock.

16. The clock divider of claim 14, wherein the decoder receives output bit 5 of the ring counter to generate a divide-by-six clock.

17. The clock divider of claim 14, wherein the decoder receives output bits 1, 3, and 5 to generate a divide-by-two clock.

18. The clock divider of claim 9, further comprising a self-initialization circuit that clears an illegal state of the ring counter.

19. An electronic device, comprising:
    a main clock generator; and
    a clock divider connected to receive the main clock and generate an output clock that is divided from the main clock by a predetermined number, the clock divider including a counter having master and slave portions, the master portion clocked by the main clock and the slave portion clocked by an inverted version of the main clock.

20. The device of claim 19, wherein the clock divider further includes a decoder receiving output bits from the counter to generate the output clock.

21. The device of claim 19, wherein the predetermined number is an odd number.

22. The device of claim 21, wherein the output clock has generally a half duty cycle.

23. A method of generating a divided clock from a main clock and an inverted version of the main clock, the method comprising:

advancing a master counter in response to the main clock;

advancing a slave counter in response to an inverted version of the main clock; and decoding output bits from the master and slave counters to generate the divided clock.

24. The method of claim 23, wherein the divided clock is divided from the main clock by an odd number.

25. The method of claim 24, wherein the divided clock has generally a half duty cycle.

26. The method of claim 23, wherein the master and slave counters form a master-slave ring counter.

27. A computer system, comprising:

a processor;

a bus device;

a master clock generator; and a clock divider receiving the master clock to generate a first clock to the processor and a second clock to the bus device, wherein the first and second clocks are divided from the master clock, and at least one of the first and second clocks is divided by an odd number, the odd number divided clock having generally a half duty cycle.

28. The computer system of claim 27, wherein the clock divider includes a master-slave ring counter having a master portion clocked by a non-inverted version of the master clock and a slave portion clocked by an inverted version of the master clock.

29. The computer system of claim 28, wherein the ring counter includes a chain of flip flops clocked alternately by the non-inverted version and inverted version of the master clock.

* * * * *